United States Patent [19]
Shieh et al.

[11] Patent Number: 5,331,658
[45] Date of Patent: Jul. 19, 1994

[54] VERTICAL CAVITY SURFACE EMITTING LASER AND SENSOR

[75] Inventors: Chan-Long Shieh; Donald E. Ackley, both of Paradise Valley, Ariz.

[73] Assignee: Motorola, Inc., Schaumburg, Ill.

[21] Appl. No.: 935,307

[22] Filed: Aug. 26, 1992

[51] Int. Cl.$^5$ .............................................. H01S 3/19
[52] U.S. Cl. .................................... 372/50; 372/92; 372/99
[58] Field of Search ........................ 372/50, 99, 92, 20, 372/38

[56] References Cited

U.S. PATENT DOCUMENTS

| | | | |
|---|---|---|---|
| 4,483,194 | 11/1984 | Rudolf | 73/517 R |
| 4,873,868 | 10/1989 | Pierre et al. | 73/517 R |
| 4,928,203 | 5/1990 | Swindal et al. | 361/280 |

FOREIGN PATENT DOCUMENTS 0369352 5/1990 European Pat. Off. .

OTHER PUBLICATIONS

Putty et al, "Process Integration for Active Polysilicon Resonant Microstructures", *Sensors and Actuators*, vol. 20, pp. 143-151, (No Month), 1989.

Linder et al, "Investigation on Free-Standing Polysilicon Beams in View of their Application as Transducers", *Sensors and Actuators*, vol. A21-A23, pp. 1053-1059 (No month), 1990.

*Primary Examiner*—James W. Davie
*Attorney, Agent, or Firm*—Miriam Jackson

[57] ABSTRACT

A vertical cavity surface emitting laser (VCSEL) having sensing capabilities is fabricated by forming a layer having the capability to change the threshold current of the VCSEL. This can be accomplished by forming a deformable membrane or a cantilevered beam on the VCSEL. The deformation of movement of the beam causes a change in the threshold current of the VCSEL, so that it can go from lasing to nonlasing or vice versa. In addition, a layer which changes reflectivity in the presence of a particular chemical can also be formed on the VCSEL to produce the same result.

27 Claims, 3 Drawing Sheets

VERTICAL CAVITY SURFACE EMITTING LASER AND SENSOR

BACKGROUND OF THE INVENTION

This invention relates, in general, to semiconductor lasers, including, but not limited to, vertical cavity surface emitting lasers (VCSELs) having a sensing capability.

In the past, silicon sensors utilized a dynamic element, such as a deformable membrane or cantilevered beam that is displaced by pressure or an applied force. The detection of this displacement is done by measuring the change in piezoresistance or capacitance. One disadvantage of these silicon sensors is that the change in resistance or capacitance is very small and difficult to detect.

Another disadvantage of these silicon sensors is that they are typically large, thus increasing the cost per device. Cost is an important factor because in most applications, such as automotive or medical applications, a multiple amount of devices are used in each application to provide redundancy.

SUMMARY OF THE INVENTION

In accordance with the present invention a semiconductor laser and sensor is fabricated. The semiconductor laser has a threshold current and is comprised of a semiconductor supporting structure, a first mirror stack positioned above the supporting structure, an active layer comprised of at least one light emitting region positioned above the first mirror stack, a second mirror stack positioned above the active layer, and a means for changing the threshold current of the semiconductor laser upon sensing a change in the environment positioned above the second mirror stack.

DETAILED DESCRIPTION OF THE DRAWINGS

Figure 1:
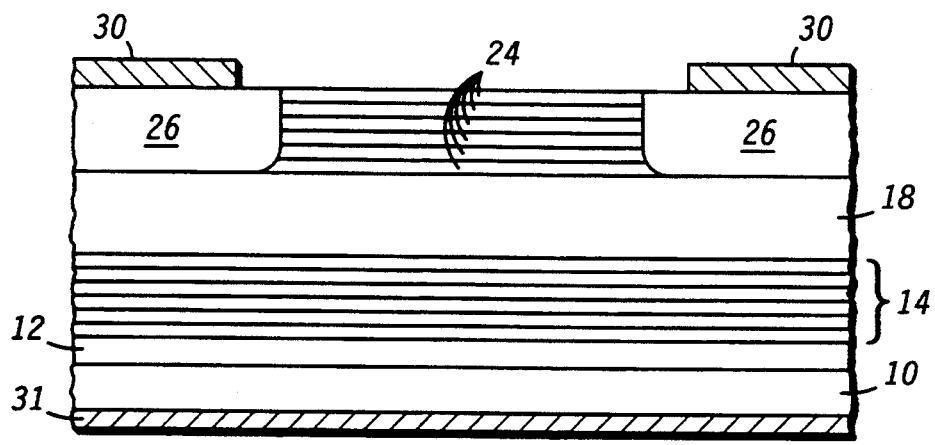
FIG. 1 illustrates an enlarged, cross-sectional view of a first embodiment of the present invention in a beginning stage of fabrication.

FIG. 1 illustrates an enlarged, cross-sectional view (not drawn to scale) of a first embodiment of the present invention in a beginning stage of fabrication. First, a VCSEL is fabricated. There are various ways to fabricate VCSELs and variations in the structure of VCSELs. Below is a description of a preferred embodiment of the VCSEL of the present invention. It should be understood that structures having variations and other methods of fabricating VCSELs can be used.

FIG. 1 shows a VCSEL comprised of a supporting structure 10 of a first conductivity type. In a preferred embodiment, supporting structure 10 is comprised of an n-type substrate. In a preferred embodiment, supporting structure 10 is comprised of gallium arsenide and is doped n-type at approximately $5 \times 10^{18}$ atoms/cm$^3$ with an n-type dopant such as silicon. Other suitable dopants may be used. Supporting structure 10 and subsequent epitaxial layers may be comprised of other III-V semiconductor materials systems such as indium phosphide.

Formed on supporting structure 10 is a buffer layer 12 of the first conductivity type. In a preferred embodiment, buffer layer 12 is comprised of a n-type gallium arsenide epitaxial layer. Buffer layer 12 is not absolutely necessary to obtain a working device, however, buffer layer 12 may be used to obtain better epitaxial growth of subsequent layers.

Next, a first mirror stack 14 of a first conductivity type is formed on buffer layer 12. First mirror stack 14 is also referred to as a ¼ wave stack or distributed Bragg reflector in the art. The formation of mirror stacks is well known in the art. A VCSEL is typically fabricated to operate at a particular wavelength, called the lasing wavelength or wavelength of operation. The material used in the first mirror stack 14 must be transparent at the lasing wavelength. In a preferred embodiment, first mirror stack 14 is comprised of alternating layers of n-type aluminum gallium arsenide (AlGaAs) with Al mole fractions of 15% and 80%.

Subsequently, an active layer 18 is formed on first mirror stack 14. Active layer 18 is preferably comprised of barrier layers and at least one quantum well which is comprised of nominally undoped gallium arsenide (GaAs). However, multiple quantum wells may be used. In addition, other materials, such as AlGaAs, may be used for different operating wavelengths, with appropriate changes to the composition of first mirror stack 14 to maintain transparency. The formation of quantum well active layers and barriers is well known in the art. The total thickness of active layer 18 must be a multiple of ½ of the wavelength of operation in order for active layer 18 to fulfill phase matching requirements in the optical cavity, which is comprised of all the layers between first mirror stack 14 and second mirror stack 24 (described below).

Thereafter, a second mirror stack 24 of the second conductivity type is formed on active layer 18. In a preferred embodiment, second mirror stack 24 is comprised of the same material as first mirror stack 14, but of the opposite conductivity type. However, a dielectric stack may also be used. The formation of dielectric stacks is well known in the art.

After the formation of second mirror stack 24, a dopant is selectively introduced into a portion of second mirror stack 24 to form a resistive region 26. In a preferred embodiment, hydrogen is ion implanted to form resistive region 26. Other suitable dopants may also be used, such as oxygen. It is desirable for resistive region 26 to be formed in a portion of second mirror stack 24 to provide for current confinement. The formation of resistive region 26 into selected regions of second mirror stack 24 can be formed by using standard photolithographic and etch techniques.

To complete the formation of the VCSEL, a second conductivity type ohmic contact 30 is formed and patterned over second mirror stack 24 to provide an opening above second mirror stack 24 where the current is confined. A first conductivity type ohmic contact 31 is also formed on the backside of supporting structure 10.

Figure 2:
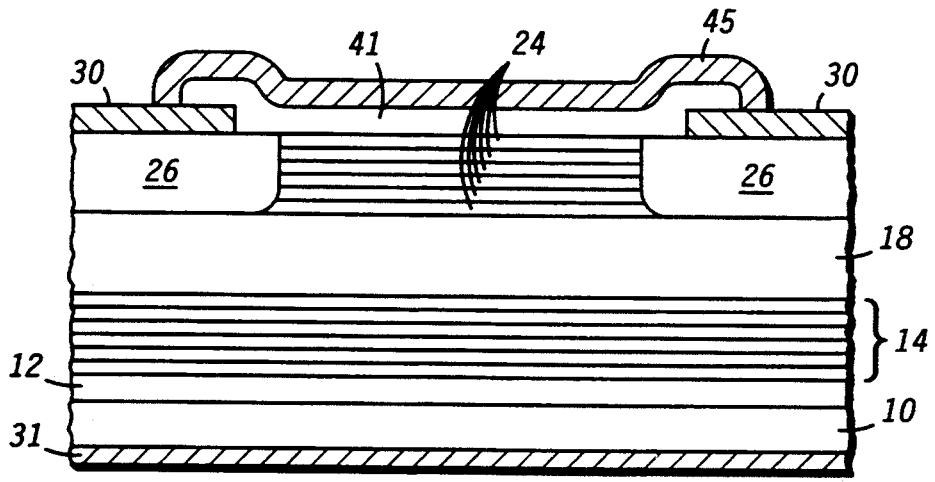
FIG. 2 illustrates the first embodiment of the present invention in a further stage of fabrication.
Figure 3:
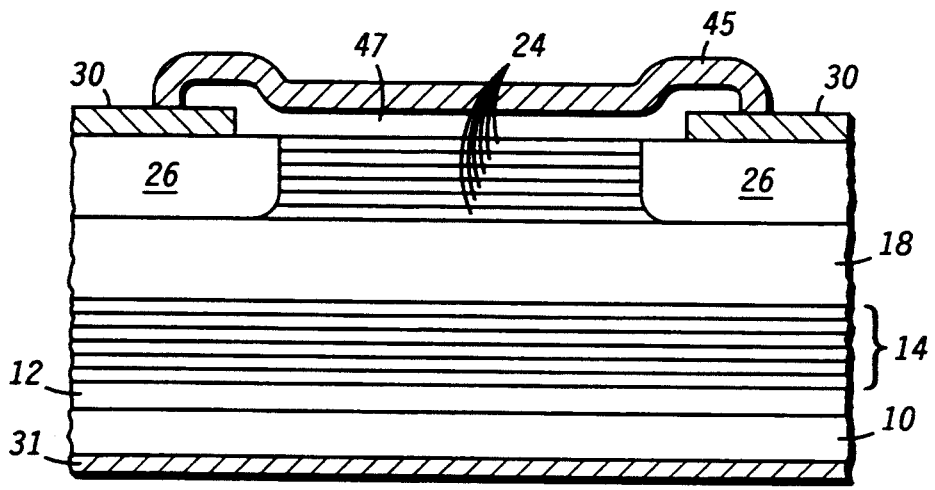
FIG. 3 illustrates the first embodiment of the present invention in a later stage of fabrication.

FIG. 2 illustrates the structure of FIG. 1 further along in processing. A means for changing the threshold current of the VCSEL upon sensing a change in the environment is then formed on the VCSEL. FIGS. 2 and 3 illustrate a first embodiment where the means for changing the threshold current of the VCSEL is comprised of a layer 45 formed above second mirror stack 24 and a portion of second conductivity type ohmic contact 30. Layer 45 is actually part of second mirror stack 24 because it works in conjunction with second mirror stack 24. In this embodiment, layer 45 is comprised of a dynamic element formed of a reflective material. Examples of reflective materials include metals or various alternating pairs of silicon/silicon dioxide. In the first embodiment this dynamic element is a deformable membrane or an air bridge positioned above second mirror stack 24. The formation of this type of dynamic element, in capacitive or piezoresistive, silicon sensors, is well known in the art. Various processes can be used, such as surface micromachining. For example, a deformable membrane can be formed by forming a spacer layer 41 over second mirror stack 24 and second conductivity type ohmic contact 30. Then, layer 45 is formed and patterned on spacer layer 41.

FIG. 3 illustrates the structure of FIG. 2 further along in processing. Spacer layer 41 is selectively etched to leave an air gap 47 between second mirror stack 24 and layer 45, as shown in FIG. 3. Spacer layer 41 is a layer that can be selectively removed while leaving layer 45 intact. For example, spacer layer 41 can be a silicon dioxide layer or a polymer if layer 45 is comprised of gold.

Figure 4:
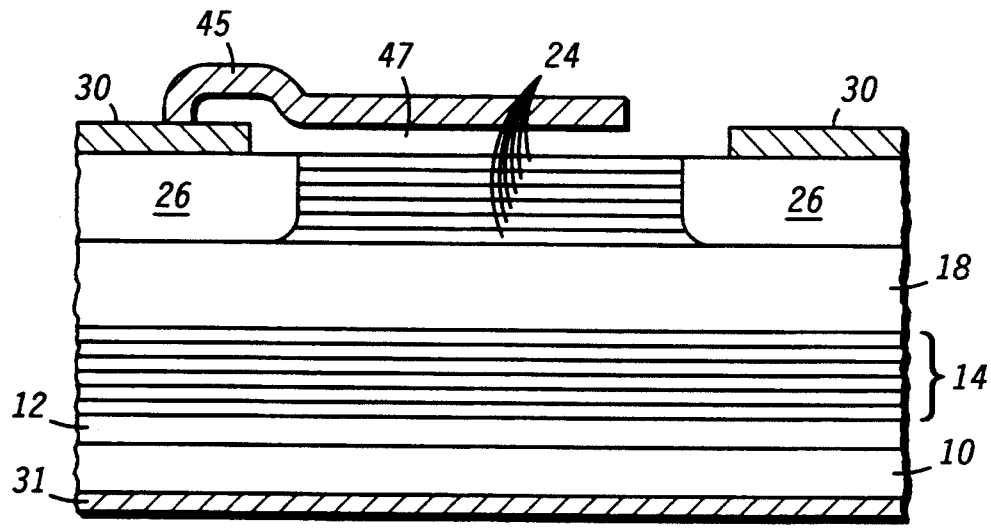
FIG. 4 illustrates a second embodiment of the present invention.

FIG. 4 illustrates a second embodiment where layer 45 is another type of dynamic element made of a reflective material. In this embodiment, the dynamic element, layer 45, is a cantilever beam positioned above second mirror stack 24. The formation of cantilever beams is also well known in the art, and is similar to the formation of a deformable membrane.

Either the deformable membrane and the cantilever beam are displaced when a force, acceleration, or pressure is applied to the environment that the VCSEL sensor is in. The sensitivity of the VCSEL sensor of the present invention may be optimized through the choice of the thickness of air gap 47. The thickness of air gap 47 will typically be in the range of approximately $\frac{1}{2}$ or $\frac{1}{4}$ the wavelength of operation. The displacement of layer 45 as a deformable membrane or cantilever beam will change the Q, and hence the threshold current, of the optical cavity of the VCSEL. Q is used in the art to describe energy storage or optical loss in the optical cavity. Because the lasing phenomenon is highly nonlinear, a tiny change in the Q of the optical cavity can make the VCSEL switch from lasing mode to nonlasing mode or vice versa.

Therefore, the laser light output can be a sensitive detection mechanism for the displacement of layer 45 as a deformable membrane or a cantilevered beam. This is in contrast to silicon sensors, where the change in resistance or capacitance is very small and difficult to detect. In the first and second embodiment, the sensitivity of the detection mechanism may be tailored or enhanced by changing the thickness of layer 45 or by adding some weight to layer 45.

Figure 5:
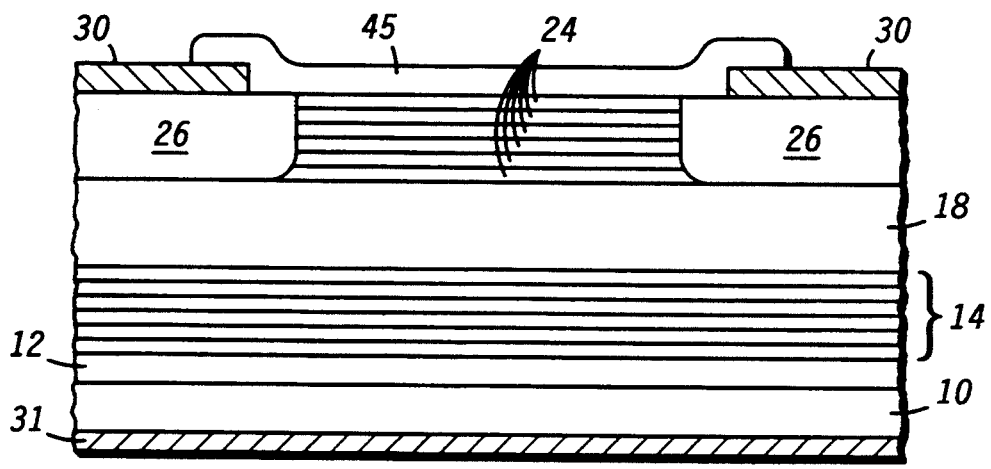
FIG. 5 illustrates a third embodiment of the present invention.

FIG. 5 illustrates a third embodiment of the present invention. Here, the means for changing the threshold current of the VCSEL is a layer which changes reflectivity upon contact with or in the presence of a chemical. This change in reflectivity would also cause the Q of the optical cavity or the threshold current of the VCSEL to change. In this embodiment, layer 45 must be of a thickness approximately equal to $\frac{1}{4}$ the wavelength of operation. For example, layer 45 may be comprised of a polymer where the index of refraction changes, and thus reflectivity changes, in the presence of a certain chemical or temperature range.

In the embodiments of FIGS. 3, 4, and 5 layer 45 must be transparent at the operating wavelength. Alternatively, the emitted light can be taken out of the backside of the VCSEL. Here, an opening in ohmic contact 31 is merely provided. This embodiment is shown in FIG. 4. The VCSEL may then be coupled with a discrete photodetector to convert the optical signal to an electrical signal.

Figure 6:
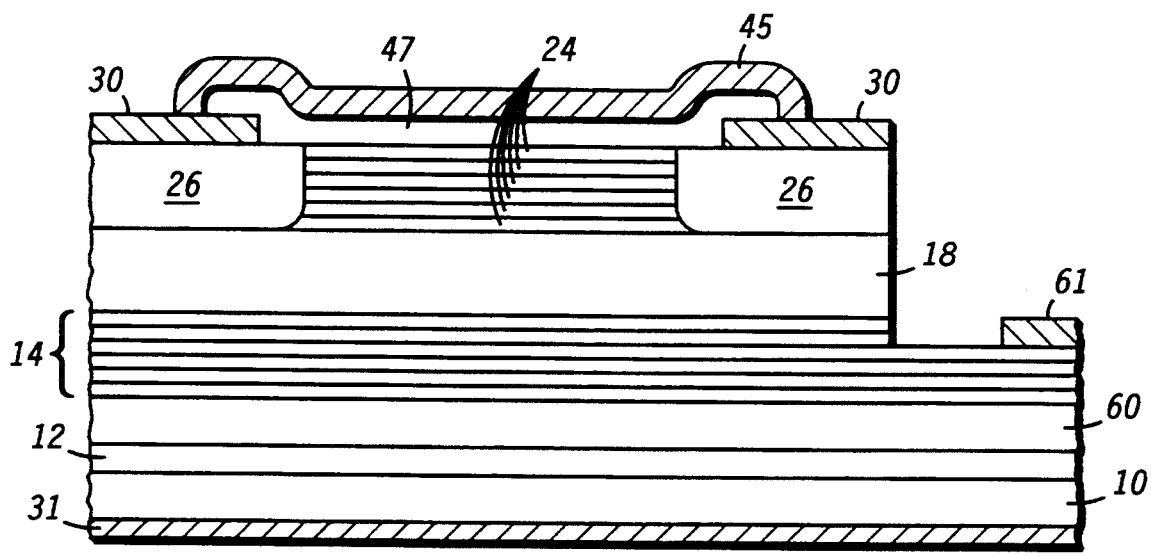
FIG. 6 illustrates a fourth embodiment of the present invention.

FIG. 6 illustrates a fourth embodiment of the present invention. A photodiode is integrated within the VCSEL to provide an electrical signal, rather than an optical signal. In this embodiment, an undoped GaAs layer 60 is fabricated on buffer layer 12 (or supporting structure 10 if no buffer layer is formed). In addition, supporting structure 10 is of the first conductivity type, preferably n-type conductivity. A portion of second mirror stack 24, active layer 18, and first mirror stack 14 is removed so that a second conductivity type ohmic contact 61 may be formed on first mirror stack 14. This embodiment can be used in conjunction with any of the embodiments shown above.

Figure 7:
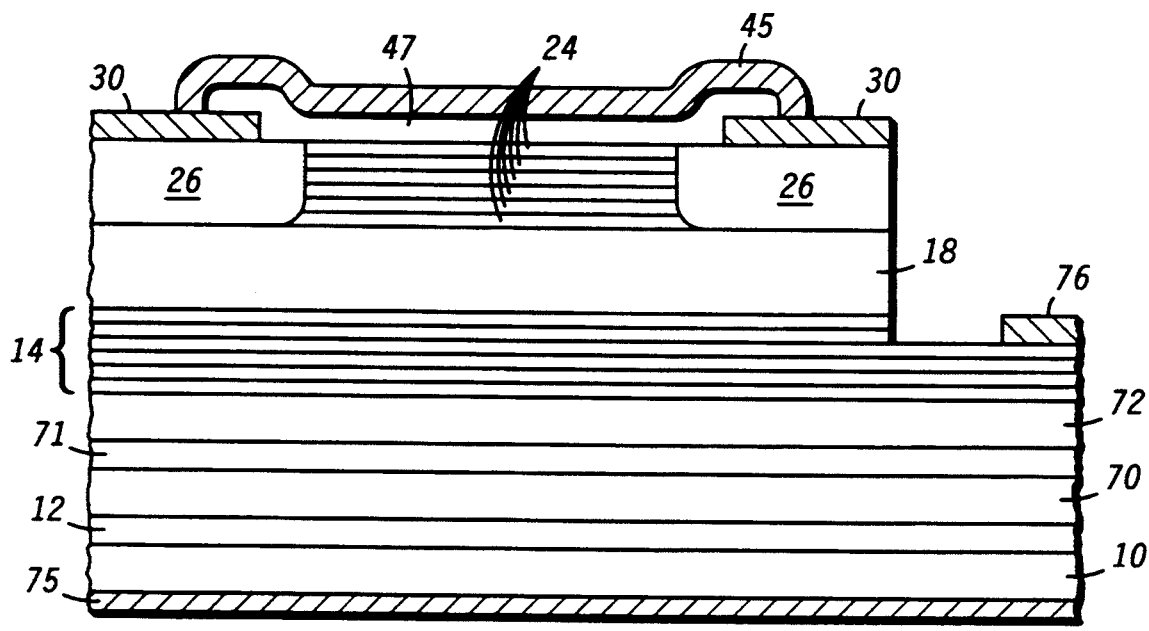
FIG. 7 illustrates a fifth embodiment of the present invention.

FIG. 7 illustrates a fifth embodiment of the present invention. A phototransistor is integrated within the VCSEL to provide the electrical signal. By using a phototransistor, the sensitivity of the device can be enhanced because the phototransistor has a current gain. A phototransistor can be integrated within the VCSEL in a similar way that the photodiode is integrated, and supporting structure 10 and buffer layer 12 are of the first conductivity type. A collector 70 of the first conductivity type is formed on buffer layer 12 (or supporting structure 10 if no buffer layer is formed), a base 71 of the second conductivity type on emitter 70, and an emitter 72 of the first conductivity type on base 71. In a preferred embodiment, collector 70 is comprised of n-type AlGaAs, base 71 is comprised of p-type GaAs, and emitter 72 is comprised of n-type AlGaAs or GaAs. First conductivity type ohmic contacts 75 and 76 are formed on the backside of supporting structure 10 and on first mirror stack 14, respectively.

The die size of the VCSEL sensor of the present invention can be small, thus lower in cost as compared to capacitive or piezoresistive, silicon sensors. For example, the active area or light emitting region of the VCSEL sensor can be approximately 20 micrometers. Capacitive or piezoresistive, silicon sensors are typically much larger than this. Thus, redundancy can be more readily provided by using the VCSEL sensor of the present invention.

As can be readily seen, the VCSEL sensor of the present invention provides for better sensitivity over silicon sensors of the prior art. The VCSEL sensor can be fabricated to provide for sensing a change in the environment in automotive, medical, and industrial applications.

We claim:

1. A semiconductor laser operating at a particular wavelength and having a threshold current, comprising:
   a semiconductor supporting structure;
   a first mirror stack positioned above said supporting structure;

an active layer comprised of at least one light emitting region positioned above said first mirror stack;

a second mirror stack positioned above said active layer; and a means for changing said threshold current of said semiconductor laser upon sensing a change in an environment positioned above said second mirror stack.

2. The semiconductor laser of claim 1 wherein said means for changing said threshold current is comprised of a deformable, reflective layer positioned above said second mirror stack, wherein said deformable, reflective layer is positioned in a range of approximately $\frac{1}{4}$ or $\frac{1}{2}$ said wavelength of operation above said second mirror stack.

3. The semiconductor laser of claim 2 wherein said means for changing said threshold current is comprised of a reflectivity changeable layer having a thickness of approximately $\frac{1}{4}$ said wavelength of operation.

4. The semiconductor laser of claim 2 wherein said means for changing said threshold current is comprised of a silicon/silicon dioxide mirror stack.

5. The semiconductor laser of claim 1 wherein said means for changing said threshold current forms an air bridge having an air gap in a range of approximately $\frac{1}{4}$ or $\frac{1}{2}$ wave between said second mirror stack and said first layer.

6. The semiconductor laser of claim 1 wherein said means for changing said threshold current is comprised of a displaceable beam positioned in a range of approximately $\frac{1}{4}$ or $\frac{1}{2}$ wave above said second mirror stack.

7. The semiconductor laser of claim 1 wherein said means for changing said threshold current is comprised of an anti-reflective, $\frac{1}{4}$ wave thick layer formed on said second mirror stack which has a capability to change reflectivity in a presence of a chemical.

8. The semiconductor laser of claim 1 further comprising a photodiode positioned within said semiconductor laser.

9. The semiconductor laser of claim 1 further comprising a phototransistor positioned within said semiconductor laser.

10. A semiconductor laser, operating at a particular wavelength and having a threshold current, comprising:

a semiconductor supporting structure;

a first mirror stack positioned above said supporting structure;

an active layer comprised of at least one light emitting region positioned above said first mirror stack;

a second mirror stack positioned above said active layer; and a first layer positioned above said second mirror stack which is capable of changing said threshold current of said semiconductor laser upon a change in an environment.

11. The semiconductor laser of claim 10 wherein said first layer is comprised of a deformable, reflective layer positioned above said second mirror stack, wherein said deformable, reflective layer is positioned in a range of approximately $\frac{1}{4}$ or $\frac{1}{2}$ said wavelength of operation above said second mirror stack.

12. The semiconductor laser of claim 10 wherein said first layer is comprised of a reflectivity changeable layer having a thickness of approximately $\frac{1}{4}$ said wavelength of operation.

13. The semiconductor laser of claim 11 wherein said first layer is comprised of a silicon/silicon dioxide mirror stack.

14. The semiconductor laser of claim 10 wherein said first layer forms an air bridge having an air gap in a range of approximately $\frac{1}{4}$ or $\frac{1}{2}$ wave between said second mirror stack and said first layer.

15. The semiconductor laser of claim 10 wherein said first layer is comprised of a displaceable beam positioned in a range of approximately $\frac{1}{4}$ or $\frac{1}{2}$ wave above said second mirror stack.

16. The semiconductor laser of claim 10 wherein said first layer is comprised of an anti-reflective, $\frac{1}{4}$ wave thick layer formed on said second mirror stack which has a capability to change reflectivity in a presence of a chemical.

17. The semiconductor laser of claim 10 further comprising a photodiode positioned within said semiconductor laser.

18. The semiconductor laser of claim 10 further comprising a phototransistor positioned within said semiconductor laser.

19. A method of fabricating a semiconductor laser, operating at a particular wavelength and having a threshold current, comprising the steps of:

providing a semiconductor supporting structure;

forming a first mirror stack positioned above said supporting structure;

forming an active layer comprised of at least one light emitting region positioned above said first mirror stack;

forming a second mirror stack positioned above said active layer; and forming a means for changing said threshold current of said semiconductor laser upon sensing a change in an environment positioned above said second mirror stack.

20. The method of claim 19 wherein means for changing said threshold current comprises forming a deformable, reflective layer positioned above said second mirror stack, wherein said deformable, reflective layer is positioned in a range of approximately $\frac{1}{4}$ or $\frac{1}{2}$ said wavelength of operation above said second mirror stack.

21. The method of claim 19 wherein forming said means for changing said threshold current comprises forming a reflective metal.

22. The method of claim 19 wherein forming said means for changing said threshold current comprises forming a silicon/silicon dioxide mirror stack.

23. The method of claim 19 wherein forming said means for changing said threshold current comprises forming an air bridge having an air gap in a range of approximately $\frac{1}{4}$ or $\frac{1}{2}$ wave between said second mirror stack and said first layer.

24. The method of claim 19 wherein forming said means for changing said threshold current comprises forming a displaceable beam positioned in a range of approximately $\frac{1}{4}$ or $\frac{1}{2}$ wave above said second mirror stack.

25. The method of claim 19 wherein forming said means for changing said threshold current comprises forming an anti-reflective, $\frac{1}{4}$ wave thick layer formed on said second mirror stack which has a capability to change reflectivity in a presence of a chemical.

26. The method of claim 19 further comprising forming a photodiode positioned within said semiconductor laser.

27. The method of claim 19 further comprising forming a phototransistor positioned within said semiconductor laser.

* * * * *